US012505981B2

(12) United States Patent
Lo

(10) Patent No.: US 12,505,981 B2
(45) Date of Patent: Dec. 23, 2025

(54) PLASMA-ENHANCED CHEMICAL VAPOR DEPOSITION FOR STRUCTURALLY-COMPLEX SUBSTRATES

(71) Applicant: Austin Lo, Traverse City, MI (US)

(72) Inventor: Austin Lo, Traverse City, MI (US)

( * ) Notice: Subject to any disclaimer, the term of this patent is extended or adjusted under 35 U.S.C. 154(b) by 114 days.

(21) Appl. No.: 18/213,958

(22) Filed: Jun. 26, 2023

(65) Prior Publication Data

US 2023/0420219 A1 Dec. 28, 2023

Related U.S. Application Data

(60) Provisional application No. 63/355,764, filed on Jun. 27, 2022.

(51) Int. Cl.
*H01J 37/32* (2006.01)

(52) U.S. Cl.
CPC .. *H01J 37/32091* (2013.01); *H01J 37/32422* (2013.01); *H01J 37/3244* (2013.01); *H01J 2237/3321* (2013.01)

(58) Field of Classification Search
None
See application file for complete search history.

(56) References Cited

U.S. PATENT DOCUMENTS

2003/0178633 A1* 9/2003 Flynn ................. H10D 62/8164 257/101
2008/0138966 A1* 6/2008 Rogojina .......... H01L 21/02488 257/E21.115
2009/0008577 A1 1/2009 Walther
2010/0200954 A1 8/2010 Del Agua Borniquel
2010/0243963 A1* 9/2010 Zehavi ...................... B02C 4/30 241/185.5
2013/0012007 A1 1/2013 Qin
2014/0377925 A1* 12/2014 Leobandung ........ H10D 86/011 438/285
2016/0247681 A1* 8/2016 Ikeda ..................... H10D 64/62
2023/0299053 A1* 9/2023 Wu ........................ H10D 88/01 257/777
2023/0377903 A1* 11/2023 Selim ................ H01L 21/02576

FOREIGN PATENT DOCUMENTS

JP 2010532549 A 10/2010
JP 2012178475 A 9/2012
KR 20220080934 A 6/2022
WO 2009005991 A1 1/2009

OTHER PUBLICATIONS

WIPO, International Search Report from PCT/US2023/026267, dated Oct. 27, 2023.
WIPO, Written Opinion of the International Searching Authority from PCT/US2023/026267, dated Oct. 27, 2023.
Office Action Received for JP App. No. 2024-571898 dated Aug. 12, 2025, 12 pages.

* cited by examiner

*Primary Examiner* — Kenneth B Wells
(74) *Attorney, Agent, or Firm* — Miller Johnson

(57) ABSTRACT

A substrate includes a first outer surface, a second outer surface opposite the first outer surface, and a region having a volume extending from the first outer surface to the second outer surface. At least a portion of the volume of this region defines a cavity of an interstitial site where the interstitial site is defined by a wall having a surface and the surface includes a plasma-formed deposition layer.

18 Claims, 12 Drawing Sheets

PLASMA-ENHANCED CHEMICAL VAPOR DEPOSITION FOR STRUCTURALLY-COMPLEX SUBSTRATES

CROSS-REFERENCE TO RELATED APPLICATIONS

This application claims the benefit of U.S. Provisional Application No. 63/355,764 filed Jun. 27, 2022. The disclosure of this prior application is considered part of the disclosure of this application and is hereby incorporated by reference in its entirety.

FIELD

The present disclosure relates to plasma-enhanced chemical vapor deposition for structurally-complex substrates.

BACKGROUND

The background description provided here is for the purpose of generally presenting the context of the disclosure. Work of the presently named inventor, to the extent it is described in this background section, as well as aspects of the description that may not otherwise qualify as prior art at the time of filing, are neither expressly nor impliedly admitted as prior art against the present disclosure.

Chemical vapor deposition (CVD) is often used in the fabrication of micro- and nano-technology. For example, CVD can be used in the manufacture of integrated circuits and photovoltaic devices. During a CVD manufacturing process, a chemical reaction produces a desired species that is deposited on a substrate. Although homogeneous reactions (i.e., gas-phase reactions) that occur before gas molecules reach the substrate are possible, generally modern techniques seek to produce a heterogeneous reaction that occurs on a surface of the substrate. This process forms a solid at the site of the reaction (i.e., on the surface of the substrate), resulting in the deposition of the solid on the substrate.

SUMMARY

This section provides a general summary of the disclosure, and is not a comprehensive disclosure of its full scope or all of its features.

One aspect of the disclosure provides for a method of depositing a material on a substrate. The substrate has a first outer surface, a second outer surface opposite the first outer surface, and a thickness extending between the first outer surface and the second outer surface. The substrate includes a charge-neutral ion deposition state within a volume of the thickness. The method of depositing a material on a substrate includes doping the substrate with plasma to generate a charged ion deposition state for the substrate. The charged ion deposition state has a non-zero electric field within a volume of the thickness. The method further includes depositing ions on the substrate doped with plasma at one or more interstitial sites within the volume of the thickness.

In some instances, doping the substrate with plasma may include exposing the substrate to nuclear radiation. In some implementations, doping the substrate with plasma occurs using a particle-based ionizing mechanism and depositing ions on the substrate doped with plasma occurs using an electrically generated plasma within a chemical vapor deposition chamber. In some examples, doping the substrate with plasma uses an ionizing mechanism initiated by a charged particle. In these examples, the charged particle may be an alpha particle or the charged particle may be a beta particle. In some instances, doping the substrate with plasma uses an ionizing mechanism initiated by a photon. The ionizing mechanism initiated by a photon may occur using gamma radiation. In some configurations, in the charged deposition state, the substrate is in a state of radioactive decay.

In some examples, the method further provides that depositing on the substrate doped with plasma occurs within a plasma-enhanced chemical deposition reactor; and doping the substrate with plasma to generate a charged ion deposition state occurs external to the plasma-enhanced chemical deposition reactor. Depositing ions on the substrate doped with plasma may include feeding a source gas into a chamber housing the substrate doped with plasma, and may apply a voltage to a radio-frequency electrode for a predetermined period of time. The predetermined period of time may correspond to the deposition rate of ions at the one or more interstitial sites within the volume of the substrate. The substrate may include a set of pores each defined by an opening greater than about ten microns.

Another aspect of the disclosure provides for a substrate that includes a first outer surface; a second outer surface opposite the first outer surface; and a region having a volume extending from the first outer surface to the second outer surface. At least a portion of the volume of this region defines a cavity of an interstitial site where the interstitial site is defined by a wall having a surface and the surface includes a plasma-formed deposition layer.

The plasma formed deposition layer may be formed by a plasma disposed within the cavity where the plasma has an ionization state initiated by a charged particle. The charged particle may be an alpha particle or a beta particle. The plasma-formed deposition layer may be formed by a plasma disposed within the cavity. Here, the plasma disposed within the cavity may have an ionization state initiated by a photon or initiated by gamma radiation. The cavity of the interstitial site may be defined by an opening greater than about ten microns.

The disclosure further provides for a system including a chamber, an electrode, and a plasma-doped substrate. The chamber has a source gas input port and an exhaust gas outlet port. The electrode is electrically coupled to a voltage source. The plasma-doped substrate faces the electrode. The plasma-doped substrate further includes a first outer surface; a second outer surface opposite the first outer surface; a region having a volume extending from the first outer surface to the second outer surface in which at least a portion of the volume defines a cavity of an interstitial site; and a plasma disposed within the cavity.

In some examples, a charged particle initiates an ionized state defining the plasma. The charged particle may be an alpha particle. The charged particle may be a beta particle. In some implementations, a photon initiates an ionized state defining plasma. In some configurations, gamma radiation initiates an ionized state defining the plasma. The cavity of the interstitial site may be defined by an opening greater than about ten microns.

The disclosure also provides for a system including a plurality of plasma cells. Each plasma cell includes: a plasma formed from a chemically non-reactive species of gas; a first wall; a second wall oppositely facing the first wall; a third wall extending between the first wall and the second wall; and a fourth wall oppositely facing the third wall and extending between the first wall and the second wall. The third wall has a voltage equal to a potential of the plasma. The fourth wall has a second voltage less than the potential of the plasma. The first wall and the second wall form a first pair of opposite facing walls that are electrically insulated and grounded. The plasma occupies a volume of the respective plasma cell between each of the first wall, the second wall, the third wall, and the fourth wall. The plurality of plasma cells are stacked in a configuration such that all third walls are on a same side of the stack facing all fourth walls on an opposite side of the stack.

In some implementations, the configuration of all third walls on the same side facing all fourth walls collinearly aligns all third walls. The configuration may form a first terminal configured to maintain the first voltage in parallel to each third wall of the plurality of plasma cells. The configuration may also form a second terminal configured to receive the second voltage and supply the second voltage in parallel to each fourth wall of the plurality of plasma cells. In some instances, the plasma is formed from the chemically non-reactive species of gas by charged particle ionization. At least one of the first voltage or the second voltage may be selectively applied. Selectively applying at least one of the first voltage or the second voltage may selectively apply a net force on the system.

BRIEF DESCRIPTION OF THE DRAWINGS

The present disclosure will become more fully understood from the detailed description and the accompanying drawings.

In the drawings, reference numbers may be reused to identify similar and/or identical elements.

DETAILED DESCRIPTION

Plasma-Enhanced Chemical Vapor Deposition

Chemical vapor deposition (CVD) or the process of chemically depositing a gaseous species on a substrate may have many forms or variants. Each type (i.e., variant) of CVD may be characterized by operating conditions (e.g., at atmospheric pressure, low pressure, ultrahigh vacuum pressure, etc.), type of vapor (e.g., aerosol-assisted or direct injection), and/or activation means. Activation refers to the initiation of the reaction that results in the deposition on the substrate. In this sense, the activation energy corresponds to an input energy that drives or catalyzes the reaction that results in deposition. Generally speaking, many of the CVD variants employ heat as the activation energy. For example, these variants may use a hot-walled CVD reactor (e.g., surrounded by a furnace) or a cold wall reactor where the substrate itself is heated.

Yet, using heat as the activation energy for CVD is not without its limitations. The heat used in a CVD process can demand a large thermal load and/or energy consumption to perform deposition. For example, when using a cold wall reactor where CVD heats a substrate to spur deposition, the substrate needs to be thermally stable at the desired temperatures. This means that the types of substrates that can be used for cold wall reactor CVD are limited to substrates that do not suffer deformation (i.e., thermal stress) from the heat that is applied to activate the CVD process. Moreover, a substrate can have temperature non-uniformities based on the heat transfer (e.g., the heat transfer rate) and construction of the substrate; causing the potential for non-uniform deposition (i.e., coating thicknesses) from the CVD process.

As an alternative, some types of CVD use plasma (e.g., an ionized gas), rather than heat, as the source of activation energy. These CVD variants are referred to as plasma-based CVD or plasma-enhanced CVD (PECVD). By utilizing plasma, rather than thermal energy, as the source of activation energy, PECVD can occur at lower temperatures than heat-based CVD. This means, for example, that PECVD may not require a high temperature furnace and therefore PECVD can be used with temperature-sensitive substrates that do not tolerate, and/or are otherwise harmed by, high temperature CVD. For example, PECVD can occur at temperatures ranging from room temperature (e.g., between 10-30 degrees Celsius) to upwards of a few hundred degrees Celsius (e.g., between 200-400 degrees Celsius), such that the actual temperature of the gas and the ions within the plasma may be roughly the same temperature.

Figure 1:
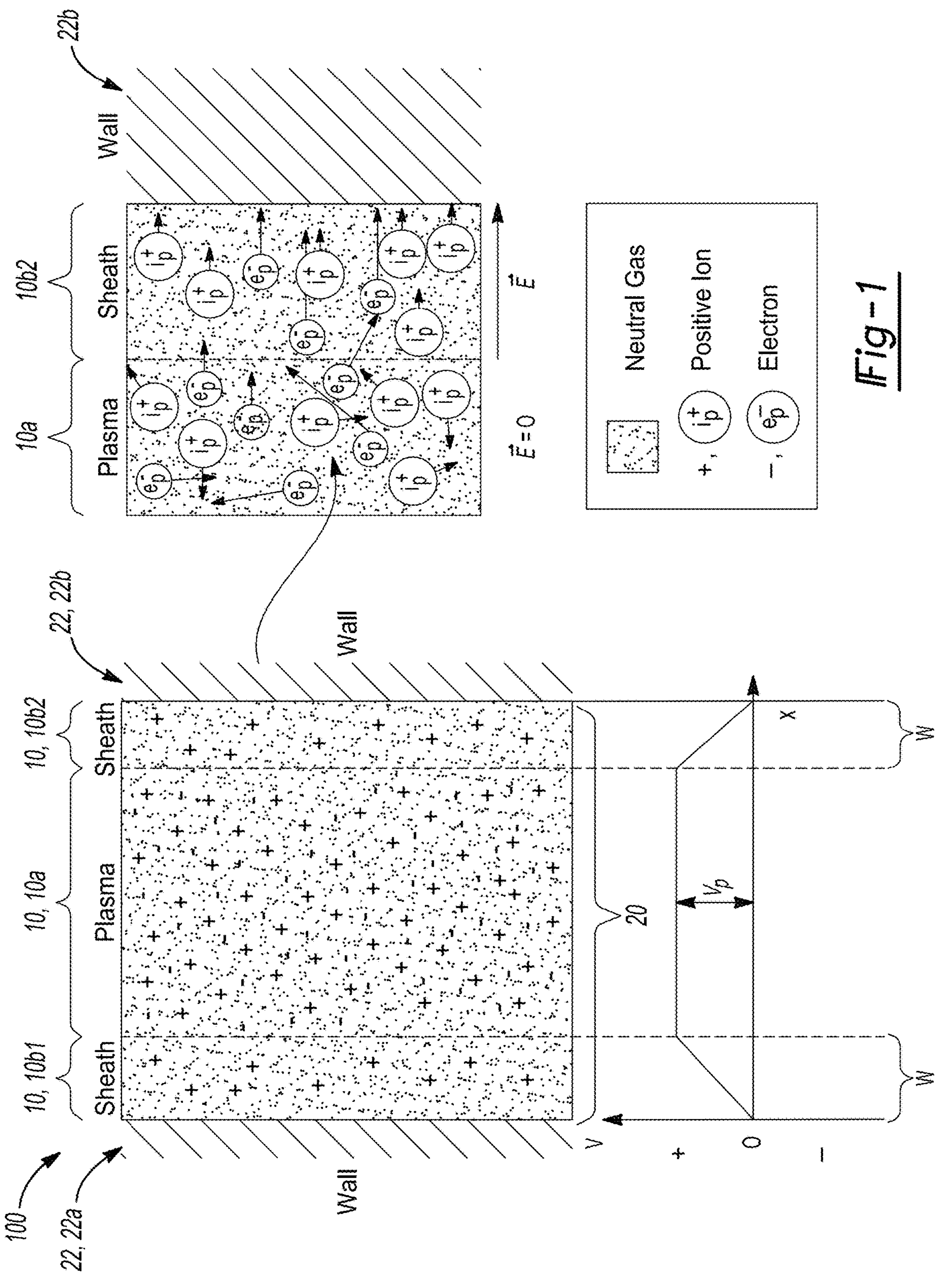
FIG. 1 is a schematic view of an example environment for a plasma according to the principles of the present disclosure.
Figure 2:
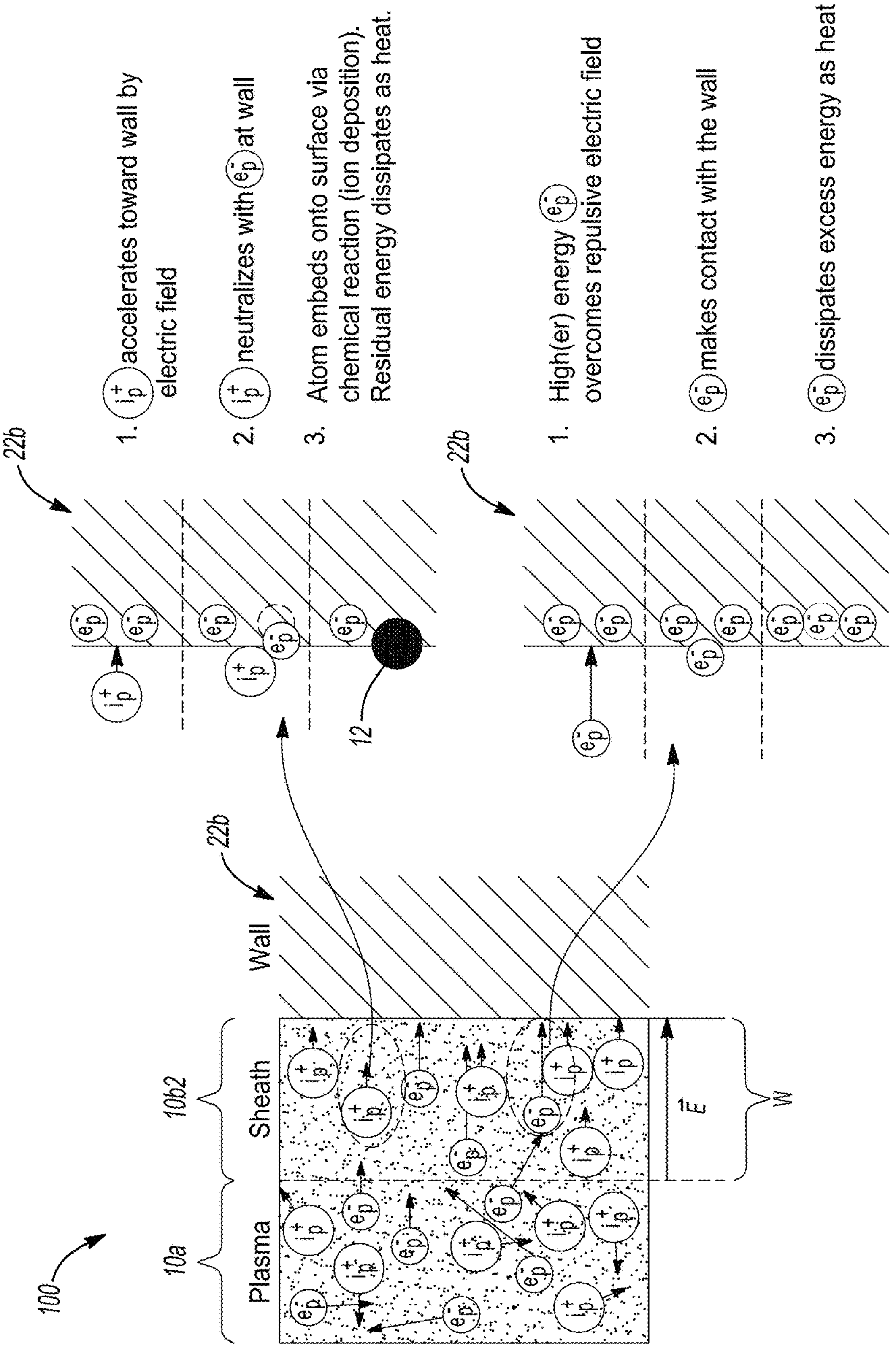
FIG. 2 is a schematic view of an example chemically-reactive environment for ion deposition according to the principles of the present disclosure.

Here, plasma refers to the fourth state of matter. In the fourth state of matter or "plasma state," electrons are disassociated from an atom to form an ionized gas. Referring to FIGS. 1 and 2, an environment 100 depicts a plasma 10 occupying a chamber 20. The behavior of the plasma 10 may be different at different locations within the chamber 20. To illustrate, the plasma 10 is shown to have a bulk region 10*a* (also referred to as a bulk 10*a*) and a sheath region 10*b* (also referred to as a sheath 10*b*). The bulk 10*a* may be disposed between, and/or otherwise surrounded by, the sheath 10*b*. In the bulk 10*a*, the plasma 10 may be charge neutral in that the number of ions and the number of electrons are relatively the same. In contrast, the sheath 10*b* refers to a region that conforms to a boundary of the shape (e.g., the shape of the chamber 20) containing the plasma 10. In other words, in FIGS. 1 and 2, the sheath 10*b* is the boundary near walls 22 of the chamber 20.

As shown in the example of FIG. 1, the sheath 10*b* may contain a surplus of ions, represented by "+," that generate a positive charge density and a positive potential. This results in an electric field that points toward, or is directed at, an adjacent wall 22. For instance, in a first sheath 10*b*1 depicted on the left of the bulk 10*a*, the electric field points at the left wall 22*a* of the chamber 20. Likewise, in the second sheath 10*b*2 depicted on the right of the bulk 10*a*, the electric field points at the right wall 22*b* of the chamber 20. With a positive potential where the electric field is directed at a respective adjacent wall 22, the ions of the plasma 10 will accelerate in the direction of the electric field toward the wall 22. As an example, FIG. 2 depicts the ions in the sheath 10*b*2 in the enlarged view as having an acceleration in the direction of the arrows toward the wall 22*b*.

A width w of the sheath 10*b* may vary depending on the overall charge density of the plasma 10 and/or the voltage applied to the wall 22. For example, as the voltage applied to the wall 22 increases, the width w of the sheath 10*b* may increase (e.g., proportionally increase by some ratio). In contrast, the overall charge density of the plasma 10 and the width w of the sheath 10*b* may have an inverse relationship. That is, as the charge density increases, the sheath 10*b* width w may decrease. Here, the charge density refers to the number of charged particle species (e.g., ions) per unit volume of the chamber 20. The sheath width w may be between tens of microns (i.e., micrometers) and hundreds of microns (e.g., 10 um, 50 um, 100 um, 200 um, 500 um, etc.).

Based on the foregoing, PECVD can manipulate an electric field to spur deposition of ions on a substrate (i.e., cause ion deposition to occur). FIG. 2 is an example of this concept. In this example, an electric field accelerates ions toward the wall 22. Here, the wall 22 may refer to a boundary such as the surface of a substrate (e.g., substrate 130 in FIG. 3) configured to receive the deposition of the precursor(s) fed into a PECVD reactor. Due to the acceleration caused by the electric field, ions may neutralize with electrons at the wall 22. This results in an atom embedding onto (i.e., adhering to) the surface via chemical reaction (i.e., ion deposition) with the residual energy being dissipated as heat. For instance, FIG. 2 depicts the ion 12 chemically adhered to the surface. With respect to electrons, higher energy electrons overcome the repulsive force of the electric field based on their kinetic energy, resulting in these electrons contacting the wall 22. The wall 22 dissipates excess energy from the contact of the electrons with the wall 22 as heat.

Figure 3:
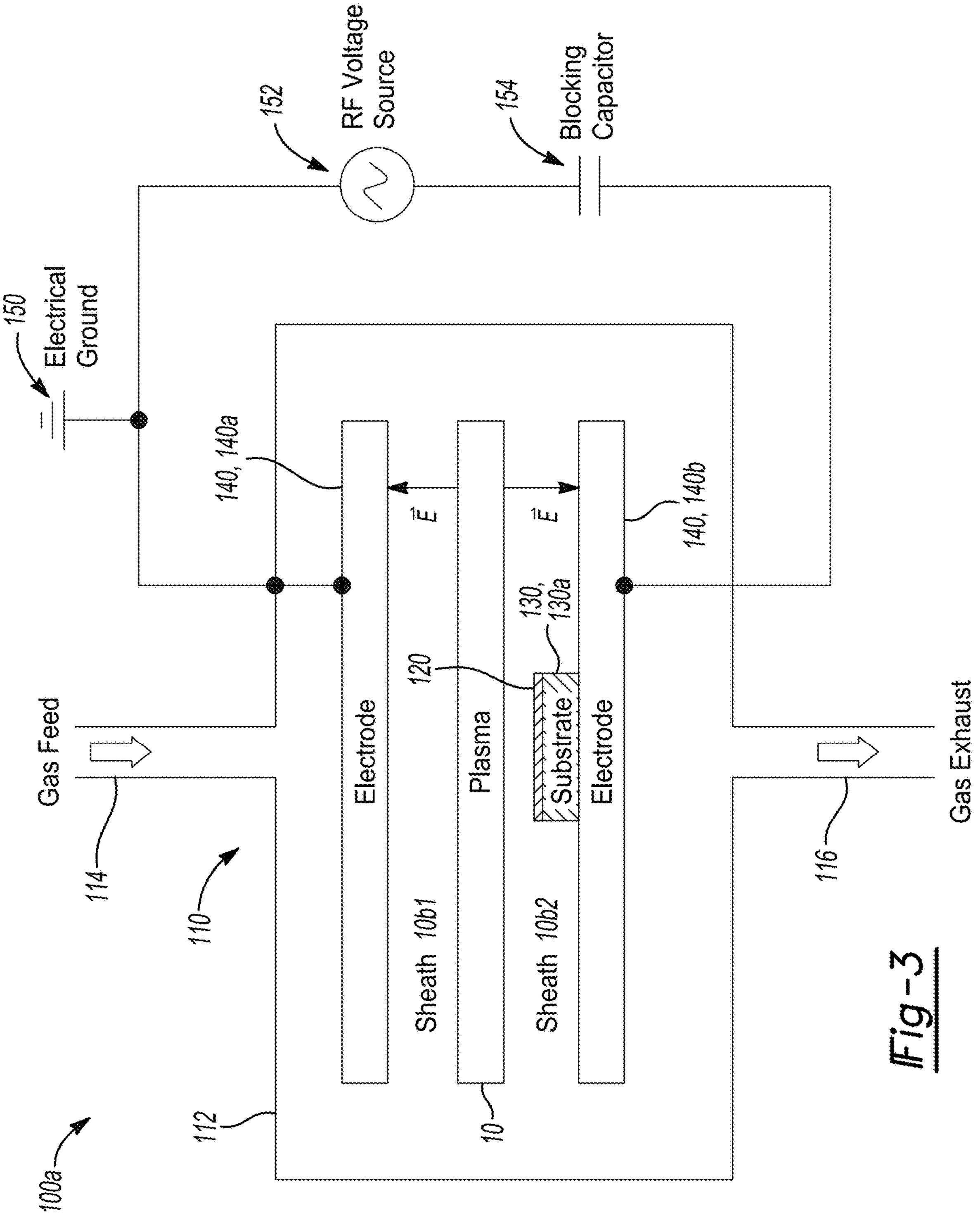
FIG. 3 is a schematic view of an example plasma-enhanced chemical vapor deposition reactor with a thin film substrate according to the principles of the present disclosure.

FIG. 3 is an example of a PECVD reactor 100*a* as the environment 100. With respect to deposition, a reactor broadly refers to the device that hosts the chemical reaction that results in deposition on a substrate. Here, the reactor 100*a* includes a chamber 110 defined by walls 112 enclosing a volume of space. The chamber 110 includes an input port 114 where a source gas (e.g., one or more precursors) is fed into the chamber 110 and an outlet port 116 that exhausts product(s) or gas out of the chamber 110 (e.g., following the termination of the deposition process). Depending on the desired deposition, the precursor or source gas may be one or more gases (e.g., provided by tank(s) in fluid communication with the input port 114) that react to form a deposition layer 120 on the substrate 130, 130*a*.

With respect to PECVD, the source gas is energized in the chamber 110 to become a plasma 10 (e.g., ionized gas). In some configurations, the plasma is electrically generated from the source gas. For example, FIG. 3 illustrates that the source gas is ionized in response to a radio-frequency (RF) electrode, 140, 140*a*. In other words, the reactor 100*a* is configured to include an electrode system 140 with an RF electrode 140*a* that oscillates between radio frequencies to energize atoms of the source gas to form the plasma 10. In this configuration, the source gas is fed into the chamber 110 and a voltage is applied to the RF electrode 140*a* to ionize the source gas within the chamber 110. The substrate 130 is typically seated on another electrode 140, 140*b* (e.g., a platen or grounded electrode) within the chamber 110 such that a sheath 10*b* of the plasma 10 forms with an electric field adjacent to the substrate 130 to promote a chemical reaction that deposits the deposition layer 120 on a surface of the substrate 130.

Figure 4:
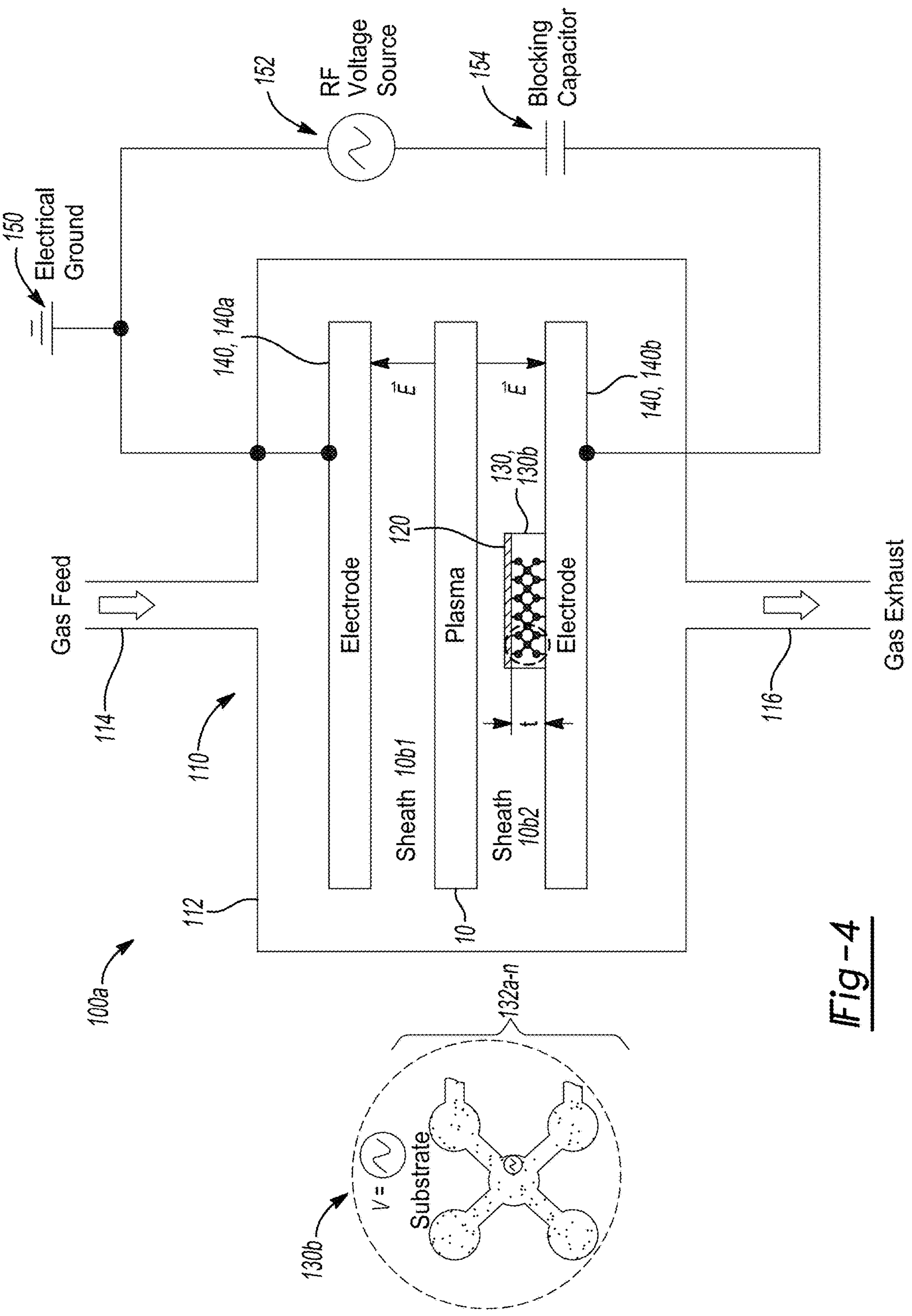
FIG. 4 is a schematic view of an example plasma-enhanced chemical vapor deposition reactor with a structurally-complex substrate according to the principles of the present disclosure.
Figure 5:
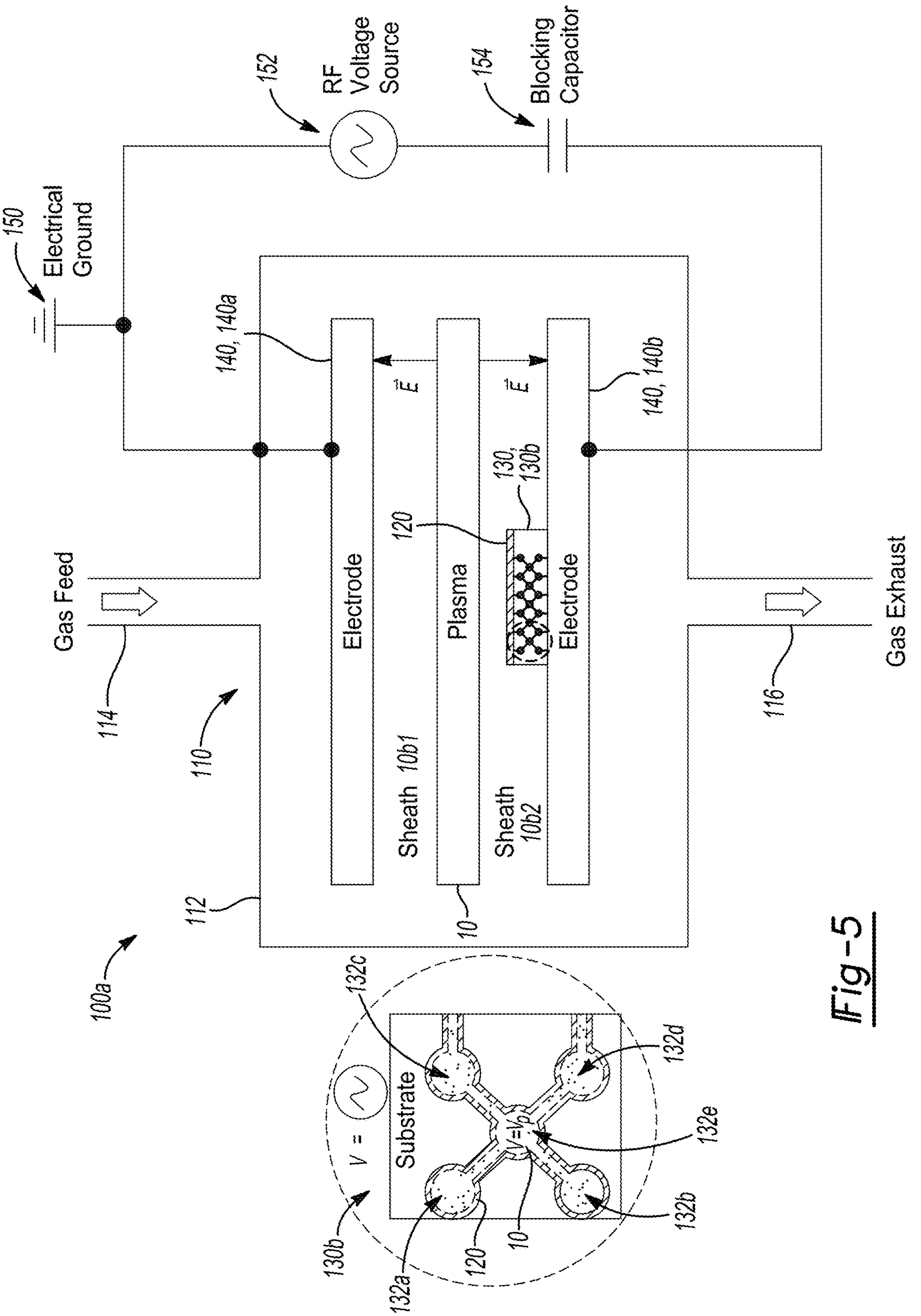
FIG. 5 is a schematic view of an example plasma-enhanced chemical vapor deposition reactor with a structurally-complex substrate according to the principles of the present disclosure.

In some example configurations, an electrical ground 150, a voltage source 152 (e.g., a RF voltage source), and/or a capacitor 154 (e.g., a blocking capacitor) may be electrically connected to the electrode system 140 (see, e.g., FIGS. 3-5). The electrical ground 150 may be disposed between the RF electrode 140*a* and the voltage source 152. The voltage source 152 may be disposed between the electrical ground 150 and the capacitor 154. The capacitor 154 may be disposed between the voltage source 152 and the electrode 140*b*.

The thickness of the deposition layer 120 may be controlled by ionizing the source gas for a designated period of time. In other words, the chemical reaction causes a deposition rate such that controlling the time of deposition can control the thickness of the deposition layer 120. For example, controlling the period of time for which the voltage source 152 is applied to electrically generate the plasma would control the length of time for which deposition is occurring on (or within) the substrate 130. In FIG. 3, the deposition layer 120 is shown as a layer on the surface of the substrate 130 facing the RF electrode 140*a*.

PECVD has traditionally been used in thin film and two-dimensional (2D) applications. That is, the process fails to form a deposition layer 120 on any aspect of the substrate 130*a* that is not an outer surface. For instance, referring to FIG. 3, the ion deposition by the PECVD reactor 100*a* is effective where the surface of the substrate 130*a* directly faces the electric field. This means that, even though a substrate 130 may have a more complex structure such as a three dimensional geometry (as shown in FIGS. 4 and 5), aspects of that structure that do not face the electric field will not receive a deposition layer 120. For the case of an electrically singular topology that has no electric field within its volume, there can be no electrically-generated plasma within its volume.

In conventional PECVD, the driven electrode 140 (e.g., the RF electrode) has a predetermined voltage. Due to the driven voltage, the substrate 130 in the electrode system 140 may have that same predetermined voltage across all surface areas. An electric field between the immediate surface of the substrate 130 facing the reference electrode 140*a* may produce a plasma 10. Any internal cavities or interstices 132 of the substrate 130, especially 3D substrates (e.g., substrate 130, 130*b*), form an equipotential surface (i.e., where the voltage is constant and the electric field is zero) and lack an electric field to produce a plasma within the volume of the substrate; this precludes the ability to deposit ions (generated by the plasma) on the surface within the volume of the substrate 130. This means that, although complex substrates 130 may have cavities or interstices 132, 132*a-n* defined by surface area(s) of the substrate that could receive a deposition layer, the surface area defining these interstices 132 remains uncoated from traditional PECVD.

To illustrate, FIG. 4 depicts the substrate 130, 130*b* as a material having a thickness t with interstices 132*a-n* throughout the volume of that thickness t. This structurally-complex substrate 130*b* may be any 3D substrate that includes pores (i.e., openings) for its interstices 132 that are greater than about ten microns (i.e., micro and macro materials). For example, these interstices 132*a-n* are shown as a repeated lattice pattern of five chambers arranged in an X to form a material matrix. Here, each chamber or interstice 132 may be defined at least in part by a wall surface area that would be capable of receiving a deposition layer. Yet, with the voltage across the outer surface area of the substrate 130*b* being uniform, there may be no gradient voltage potential across the thickness of the 3D material, resulting in no charge density within the substrate 130*b*. According to Gauss's law of electrostatics, if there is no charge density inside the substrate 130, there can be no electric field within that substrate 130. Without an electric field, the ion deposition process of PECVD will fail to occur within the volume of the substrate 130. Stated differently, there is no vehicle to accelerate ions to a surface area within a substrate (e.g., the walls forming the interstices 132 of a 3D substrate). With no electric field or a charge neutral plasma within a substrate 130, ion deposition by PECVD may not deposit ions inside a volume of any material that is greater than a few microns thick.

Yet, if a plasma 10 exists before or despite the electrically driven source, there will be an electric field or gradient voltage potential caused by the plasma 10. Based on this principle, if a plasma distribution is placed or injected within the substrate 130 that undergoes the PECVD process, the substrate 130 will have a non-zero electric field within the volume of its thickness. With a non-zero electric field within the substrate 130, the substrate 130 has a charged ion deposition state that is capable of receiving ion deposition within a volume of its thickness. In other words, although a substrate 130 typically has an initial ion deposition state within the volume of its thickness that does not permit ion deposition, that initial ion deposition state can be altered by doping the substrate 130 with plasma 10 (e.g., prior to the PECVD process) to enable the PECVD process to deposit ions on the substrate 130 (e.g., substrate 130*b*) doped with plasma at one or more interstitial sites 132 within the volume of the substrate 130.

For comparison, FIG. 5 depicts the same substrate of FIG. 4 except that the substrate 130*b* has been doped with plasma 10. When this plasma-doped substrate 130*b* undergoes PECVD, the plasma 10 that exists within the substrate 130*b* will facilitate ion deposition. In other words, the plasma 10 within the substrate 130*b* may have a sheath 10*b* with an electric field that accelerates ions to be deposited on the wall(s) of an interstitial site 132 within the volume of the substrate 130. Since any pore of the substrate 130 is of a size that is accessible to a plasma 10 (e.g., greater than about ten microns), any micro or macro porous material can receive ion deposition within its volume in addition or alternative to ion deposition on its outer surface.

Plasma-Doping a Substrate

A plasma-doped substrate generally refers to a substrate (e.g., substrate 130*b*) whose three-dimensional volume contains a plasma (e.g., plasma 10). That is, an ionized gas may be disposed within the volume of the substrate. Although a process like PECVD creates a plasma using an electric field (e.g., from an electrode system shown in FIG. 3), an electric field is not the only way to generate plasma. Since a plasma is an ionized gas, a process that stimulates ionization can introduce or dope a substrate with plasma. One way that ionization occurs is by ionizing radiation. When energy is emitted from a source, that process is referred to as radiation. Ionizing radiation is a type of radiation where the energy that is released by an atom travels in the form of an electromagnetic wave (e.g., a gamma or X-ray) or a particle (e.g., a neutron, beta, or alpha). For instance, ionizing radiation may occur from nuclear processes (also referred to as nuclear radiation) such as radioactive decay (gamma decay, beta decay, alpha decay).

In some examples, when ionizing radiation occurs, charged particles with high energy escape a material and are able to travel into a gas. The charged particles in the gas are able to ionize the gas to produce a plasma. In this sense, the plasma is not electrically generated, but rather generated by a physical particle (referred to as particle-based) or an electromagnetic wave (referred to as wave-based) as the ionizing mechanism. Using this ionizing mechanism, a substrate may be plasma-doped by being activated by a particle or an electromagnetic wave. For instance, a substrate may be plasma-doped with a particle-based ionization mechanism. Some types of particles that may be used for particle-based ionization are alpha particles (e.g., a particle with two protons and two neutrons) and beta particles (e.g., a particle with the size and mass of an electron—an electron or a positron). In contrast, if the substrate is plasma-doped with a wave-based ionization mechanism, the wave may occur from gamma radiation (e.g., due to a photon) or X-ray radiation (e.g., energy from a wavelength between 10 picometers and 10 nanometers). Neutron particles may be used to facilitate ionization indirectly because a neutron will not directly ionize a gas since neutrons are not a charged particles that interact electrically. A neutron therefore facilitates nuclear reactions (e.g., by absorption) which will then be followed by subsequent radioactive decay (e.g., via an alpha, a beta, or a gamma emission) that ionizes the gas.

Combining this concept with PECVD, a substrate is able to undergo ion deposition within its structure (i.e., not only on its surface), if the substrate is plasma-doped before the electric field is applied by the PECVD process. One approach to have the substrate doped with plasma prior to the PECVD process is to introduce ionizing radiation (e.g., from a nuclear process) to the substrate. For example, the substrate is placed within a nuclear reactor such that the ionizing radiation caused by the nuclear process within the reactor "activates" or plasma-dopes the substrate. Here, the activated substrate (i.e., plasma-doped substrate) would begin to decay, but the substrate material may be selected such that the decay rate for the substrate permits the PECVD process to occur with the plasma-doped substrate before the decay completes and the substrate is no longer plasma-doped. For instance, a nuclear reactive material like copper can capture a neutron and beta decay to produce the plasma within its volume. The plasma-doped copper can then receive ion deposition from a PECVD process (e.g., shown in FIG. 5) and have a deposition layer 120 formed on a surface area within the volume (e.g., in addition to on its outer surface). Broadly speaking, this means that a substrate can be introduced to a charged-particle ionizing source to have its initial ion deposition state within its volume become a charged ion deposition state.

Applications of Structurally Complex Substrates

Structurally complex substrates (also referred to as "foams") that have been able to receive ion deposition (i.e., plated) at their interstitial sites (i.e., a plated foam) may be used in a wide range of applications. One such application is that a plated foam may be used for one or more electrodes of a structured plasma cell energy converter (also referred to as an energy converter). As described in U.S. patent application Ser. No. 17/202,952 titled "Structured plasma Cell Energy Converter for a Nuclear Reactor," which is hereby incorporated herein by reference, a structured plasma cell energy converter is capable of generating electricity (i.e., power) based on the quantity of electrons (or charge density) that successfully travel from an emitting electrode to a collecting electrode. In some examples, the electricity may drive an electrical load 182 (see, e.g., FIGS. 6 and 7). The higher the current density, the greater the amount of electricity that the energy converter produces. Furthermore, the charge density is also dependent on the surface area of both the emitter electrode (e.g., emitter electrode 160) and the collector electrode (e.g., collector electrode 170). An emitter electrode with a larger surface area increases the quantity of emitted electrons while a larger surface area of the collector electrode increases the collection area to collect emitted electrons.

Figure 6:
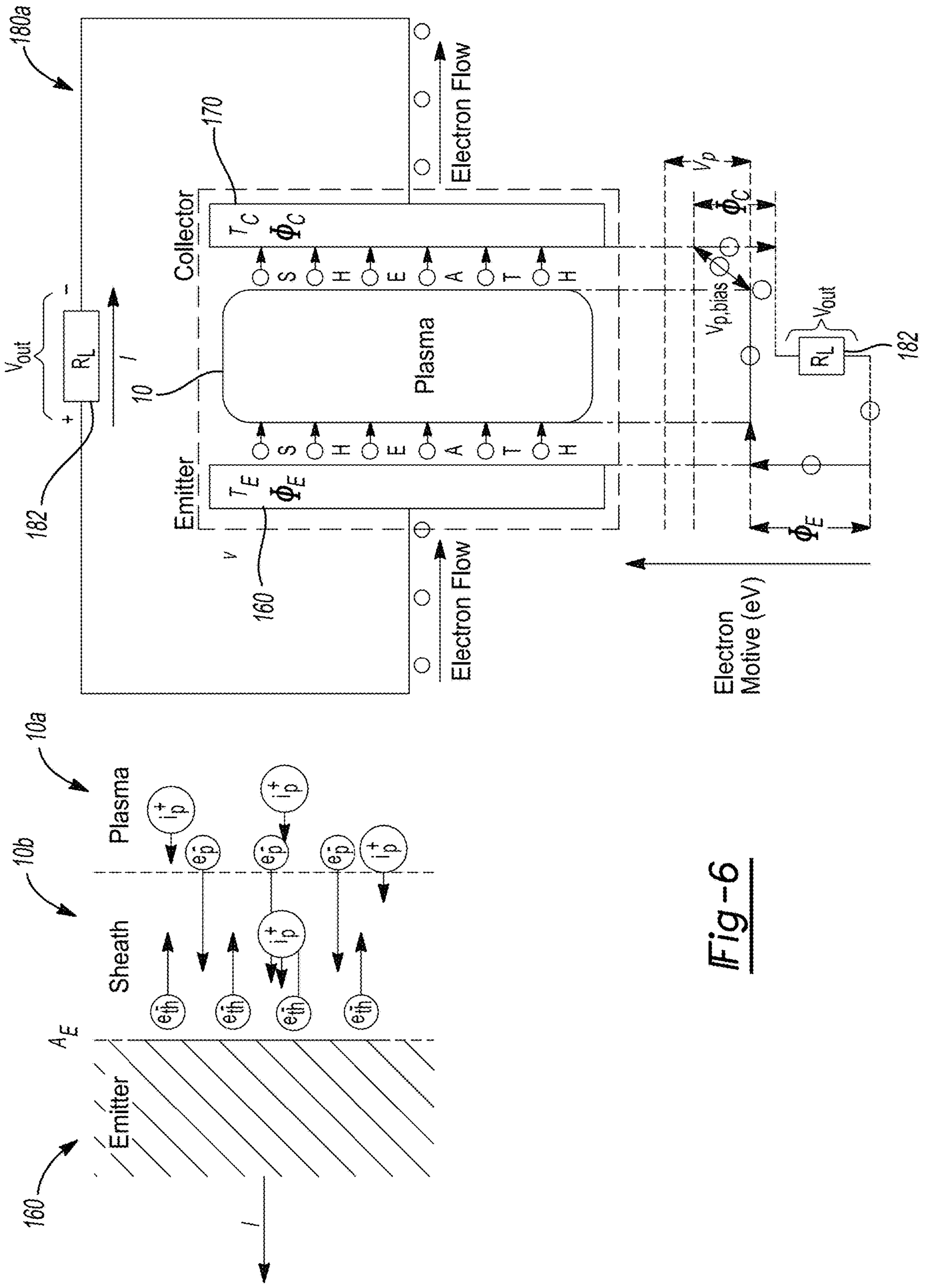
FIG. 6 is a schematic view of an example non-foam energy converter system according to the principles of the present disclosure.
Figure 7:
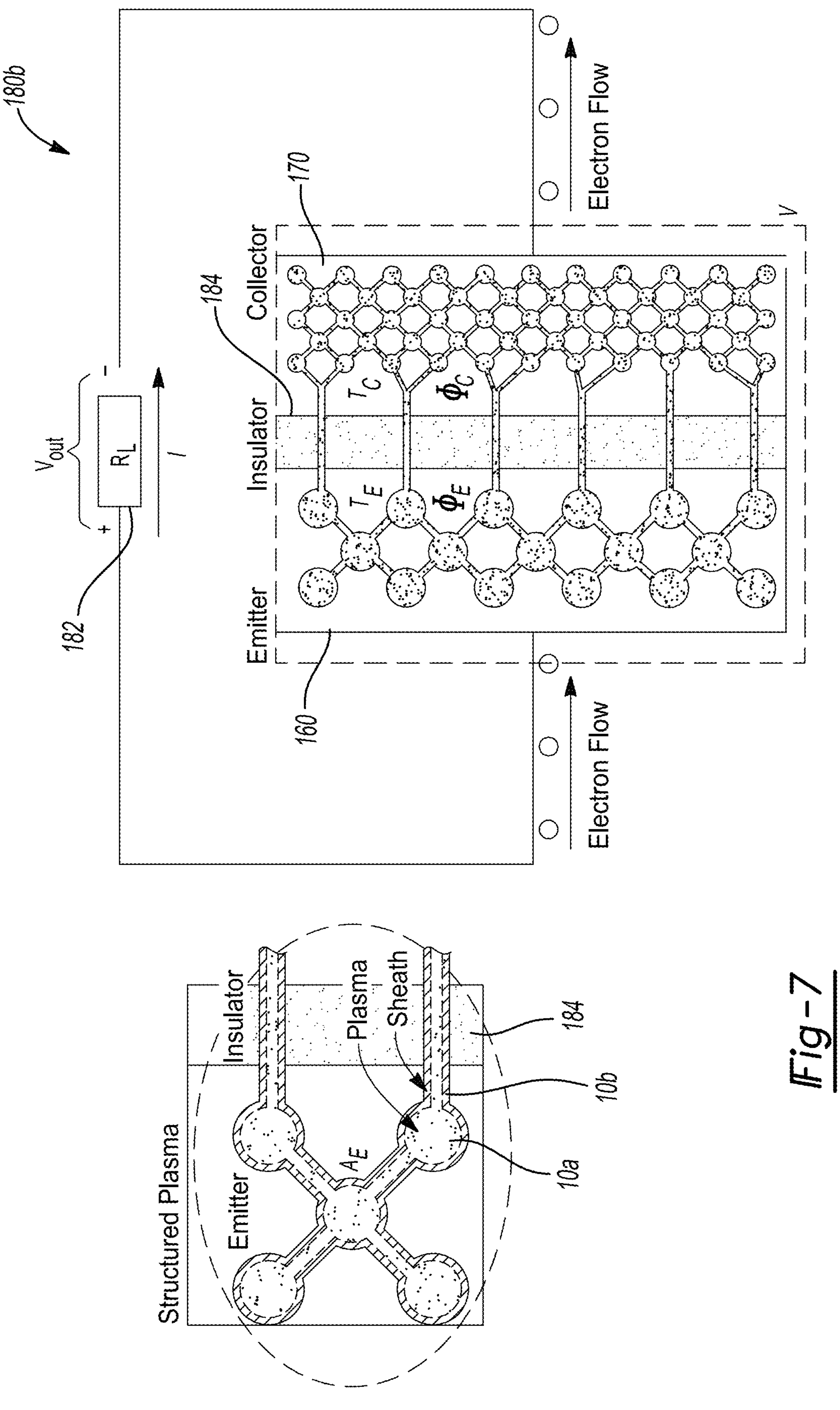
FIG. 7 is a schematic view of an example foam energy converter system according to the principles of the present disclosure.
Figure 8:
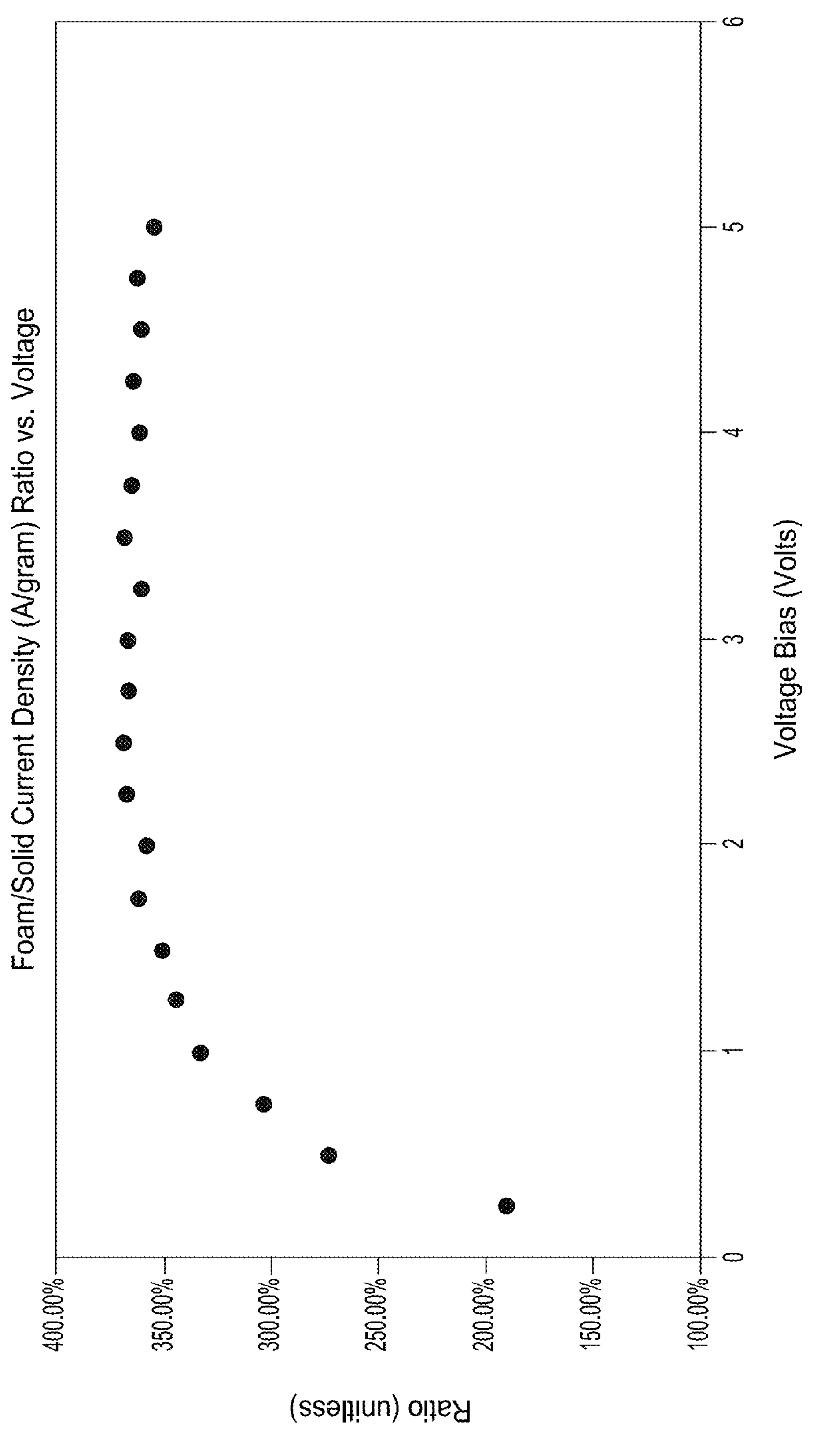
FIG. 8 is a graphical view of current density as it relates to a structure of an electrode for an energy converter system according to the principles of the present disclosure.

As seen when comparing FIG. 6 (a non-foam energy converter system 180*a*) and FIG. 7 (a foam energy converter system 180*b*), to increase the available surface area of the electrodes, the energy converter may use plated foams that have ion deposition at their interstitial site(s) as the emitter and/or collector electrodes 160, 170. By leveraging this type of complex substrate (e.g., rather than merely a surface deposited thin film like FIG. 6), FIG. 8 depicts that the current density of a plated foam can be nearly 350% greater than that of a solid substrate formed from the same material as the plated foam, meaning that the power produced by an energy converter that uses plated foams for electrodes may increase (e.g., several fold).

Even more broadly, the output voltage and accordingly output power for an energy converter is based on a difference in work function between the collector electrode 170 and the emitter electrode 160. To generate electrodes with a desired difference in work function, the energy converter may use the PECVD process with a plasma-doped substrate. That is, a first material type or first shape of foam may be used for the emitter electrode 160 while a second material type or second shape of foam may be used for the collector electrode 170. With two dissimilar materials (or material shapes), a net amount of energy can be collected from the plasma itself. For example, experimentation with materials of dissimilar work function has shown that, even without current applied to the system to facilitate electron flow, there is an open circuit voltage that is equal to the difference between work functions. This means that energy can be collected across a plasma between an emitter and collector based on the ionized state of the plasma without a heat source boiling off electrons at the emitter.

In some examples, an energy converter uses a plasma-doped and plated foam to remove the plasma from the inner electrode gap. In other words, in configurations described in U.S. patent application Ser. No. 17/202,952, the inner electrode gap may include the plasma as a way to prevent a space charge effect from happening between electrodes. Since a plated foam may already be plasma-doped, the plasma-doped portion of the substrate may function to facilitate electron transfer to the collector without the plasma performing a similar role in the inner electrode gap. In some example configurations, an insulator 184 may be disposed in the inner electrode gap (see, e.g., FIG. 7). The insulator 184 may be configured to provide electrical isolation between the emitter electrode 160 and the collector electrode 170.

Figure 9:
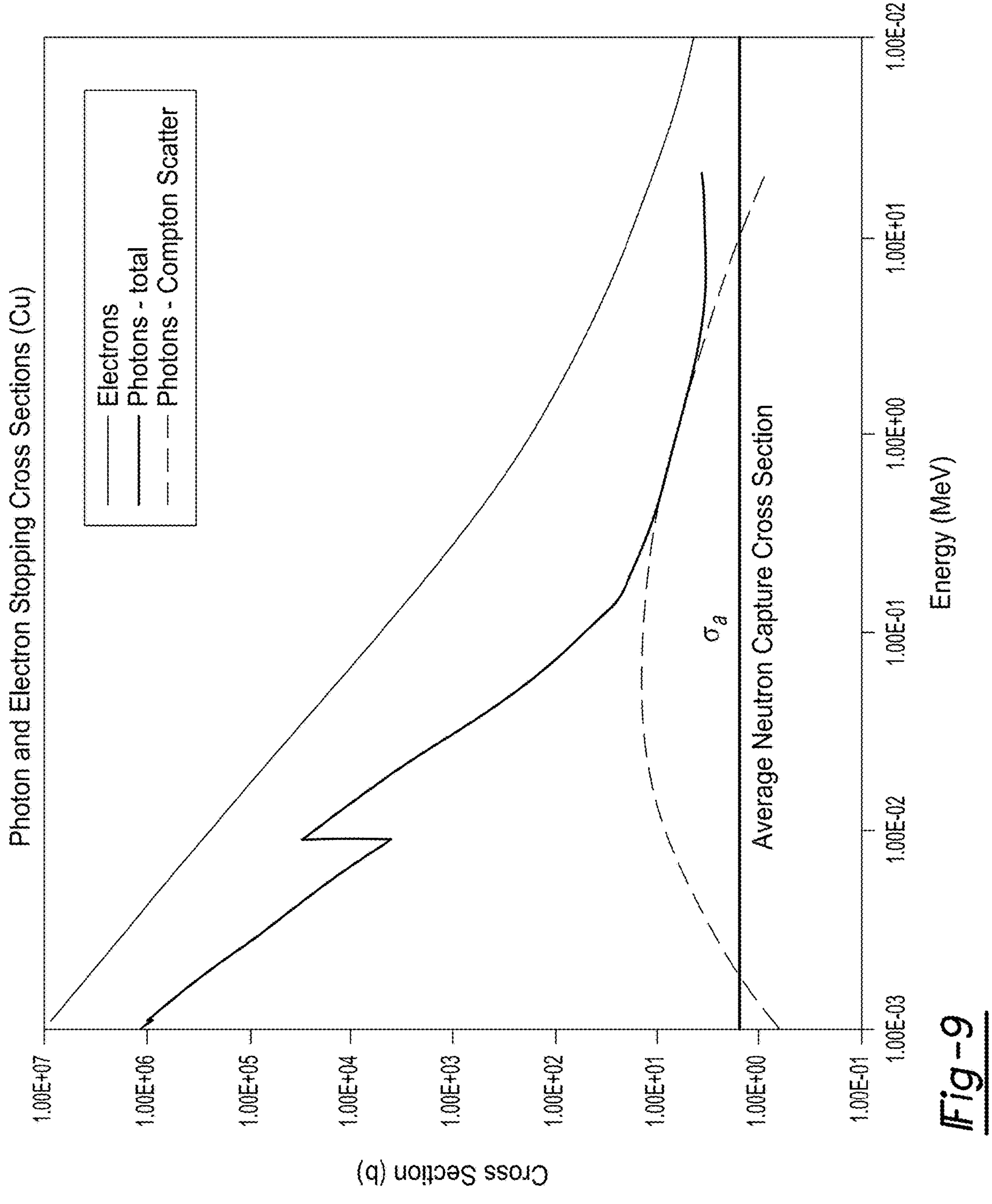
FIG. 9 is a graphical view of stopping cross section versus energy according to the principles of the present disclosure.

Referring to FIG. 9, the stopping power or energy deposition per unit length can be used to dictate optimal properties (e.g., geometry or thickness) of the substrate to achieve successful plasma-doping of that substrate. In other words, when the stopping power is high, a wave (e.g., a photon) or a particle generally has poor depth of penetration into the substrate. Yet when the stopping power is low, a wave (e.g., a photon) or a particle has a high depth of penetration into the substrate. When there is a high depth of penetration, high energy particles have a more uniform and thorough deposit of energy that promotes successful ionization of the gas within the substrate. The ionizing mechanism to plasma-dope the substrate may occur when a wave (e.g., a photon) or a particle interacts with a solid portion of the substrate and displaces an electron out of the solid portion of the substrate and into the porous region (e.g., with interstices) to energize the gas occupying a volume of the porous region.

Propulsion-Capable Plasma Cell

Figure 10:
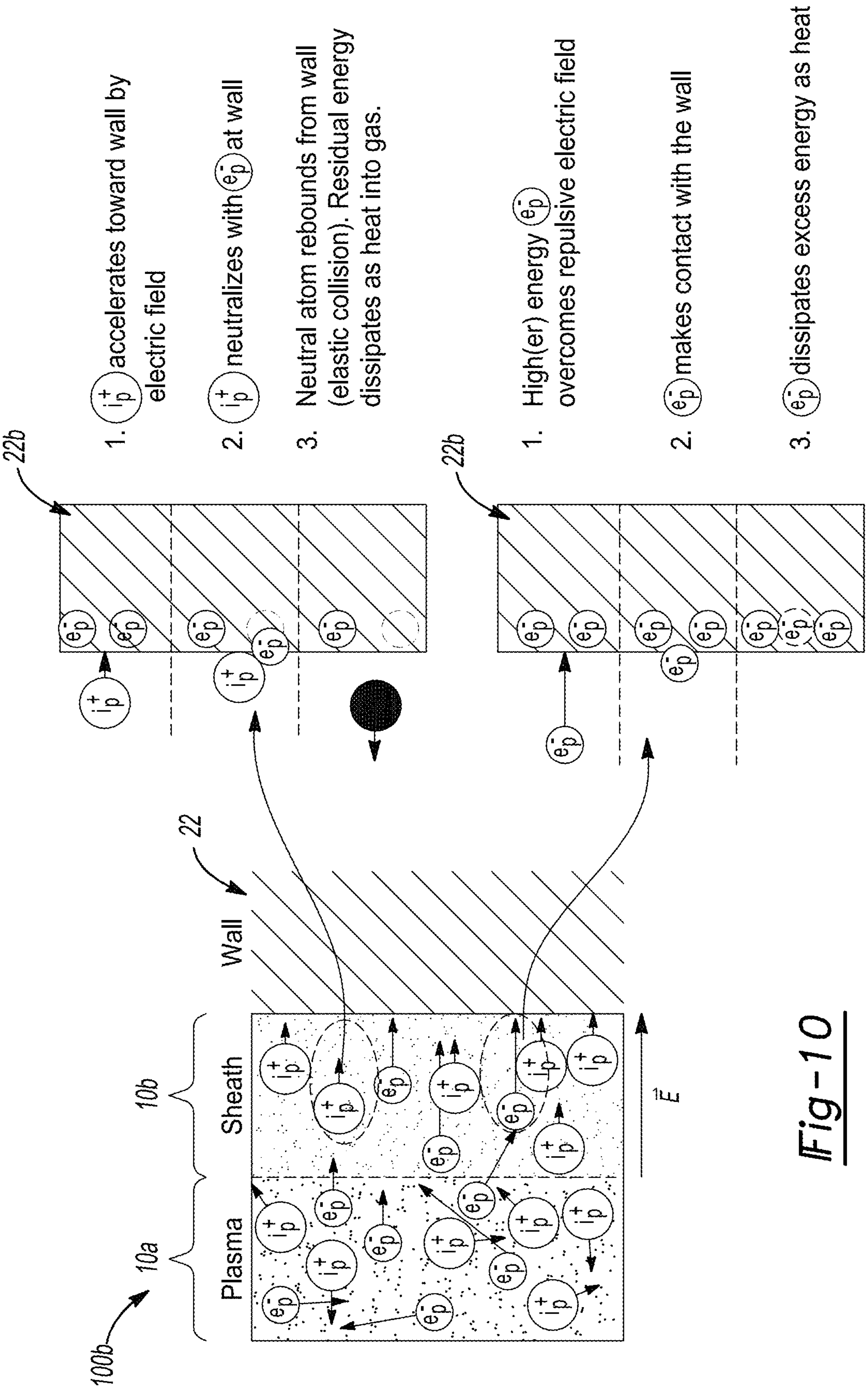
FIG. 10 is a schematic view of an example chemically-non reactive plasma environment according to the principles of the present disclosure.

In contrast to FIG. 2 that illustrates ion behavior for a plasma generated from a chemically reactive species, FIG. 10 depicts ion behavior for a plasma generated from a chemically non-reactive species. Here, a chemically non-reactive species refers to a gas with molecules that do not chemically react (i.e., are chemically inert) when subject to ionization. In a chemically non-reactive environment 100, 100*b*, the electric field of the sheath 10*b* will accelerate the ions towards the wall 22. Once the ions (e.g., shown as "$i_p^+$") reach the wall, the ions neutralize with the electrons (e.g., shown as "$e_p^-$") at the wall 22. When the gas species that forms the plasma is non-reactive, the neutralization between an ion and an electron at the wall 22 does not form a chemical adhesion on the wall 22 (i.e., ion deposition) like a reactive species, but instead results in a neutral atom (combination of the ion and the electron) rebounding from the wall 22. The residual energy from this elastic collision of the ion with the wall 22 dissipates as heat into the gas. FIG. 10 depicts this rebounding collision with a darkened circle being the neutral atom.

The elastic collision with the wall 22 means that there was a net momentum transferred by the ion to the wall 22. Due to this momentum, the colliding ion exerts a pressure on the wall 22. Here, the pressure on the wall 22 may be represented by the following equation:

$$\frac{F}{A} = 4n_i\sqrt{T_e V_s} \tag{1}$$

where F/A is the pressure; $n_i$ is the ion density of the plasma; $T_e$ is the electron temperature; and $V_s$ is the sheath voltage. This means that the pressure exerted on the wall is proportional to the ion density of the plasma multiplied by the square root of the electron temperature and the sheath voltage. Here, the sheath voltage includes the potential of the plasma combined with any applied voltage (i.e., voltage applied across the plasma or voltage potential of the wall 22).

Figure 11:
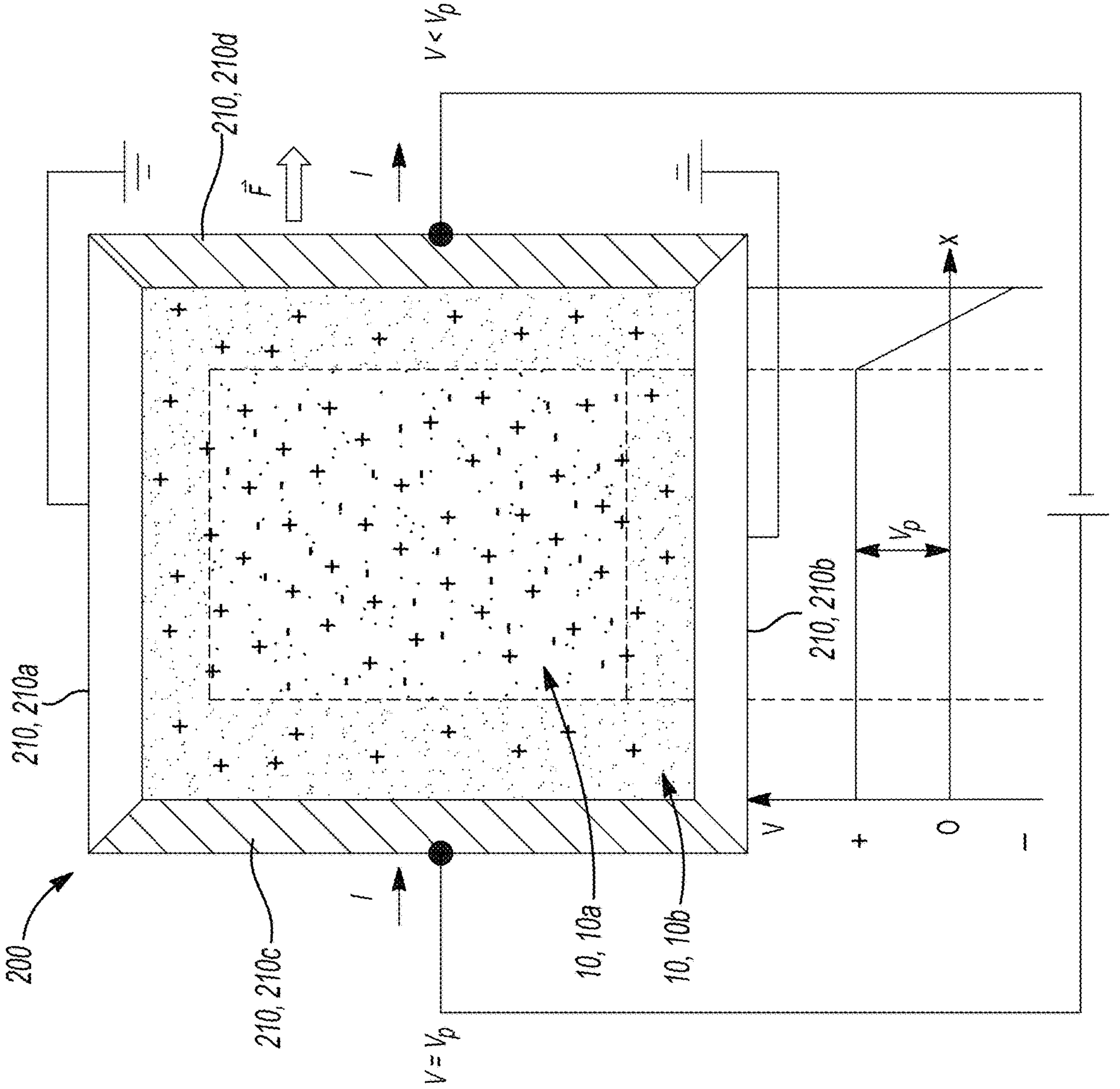
FIG. 11 is a schematic view of an example plasma cell according to the principles of the present disclosure.

In some examples such as shown in FIG. 11, the plasma generated from a chemically non-reactive species may be used to construct a plasma cell 200 capable of propulsion. In these examples, the plasma cell 200 refers to a volume of space that a plasma 10 may occupy that is enclosed by a plurality of walls 210. For example, the arrangement of walls 210 three-dimensionally resembles that of a rectangular prism and therefore two-dimensionally resembles a box as shown in FIG. 11. For simplicity of explanation, the electrostatics of the plasma cell 200 are described with respect to a two-dimensional, four-walled box. Yet these same aspects of the plasma cell 200 represented by FIG. 11 are capable of being implemented for a 3D structure such as a rectangular prism or another 3D shape (e.g., a cylindrical structure).

In some configurations, such as shown in FIG. 11, the plurality of walls 210 includes a first wall 210*a*, a second wall 210*b*, a third wall 210*c*, and a fourth wall 210*d*. In this example arrangement, the first wall 210*a* oppositely faces the second wall 210*b* while the third wall 210*c* oppositely faces the fourth wall 210*d*. For example, the first wall 210*a* is in a parallel arrangement with the second wall 210*b* while the third wall 210*c* is in a parallel arrangement with the fourth wall 210*d*. As shown in FIG. 11, the third and fourth walls 210*c,d* extend between the first and second walls 210*a, b*. For instance, FIG. 11 illustrates the third and fourth walls 210*c, d* as perpendicular to the first and second walls 210*a, b*. In an example that would form a cylindrical shape, the first wall 210*a* and second wall 210*b* may correspond to two opposite facing portions of a curved wall.

Generally speaking, since the sheath 10*b* of the plasma 10 generates an electric field that accelerates ions towards a wall, a box with a sheath 10*b* conforming to each side may mean that the pressure exerted by the acceleration of ions against the four walls like that of FIG. 11 may be overall balanced for the plasma cell 200. For example, although a force would be exerted on the first wall 210*a* and the third wall 210*c* by the acceleration of ions, the force exerted on the second wall 210*b* and the fourth wall 210*d* would cancel those forces, resulting in a zero net force for the container of the plasma cell 200. Yet in contrast, if the electric field in the sheath corresponding to one or more walls 210 was selectively manipulated, the result may be a non-zero net force being exerted on the plasma cell 200.

Building on this approach, FIG. 11 depicts an example of a single plasma cell 200 where different walls (e.g., walls 210*a*-210*d*) have different applied voltages or no voltage potential at all (e.g., grounded) to propel ions toward a particular wall 210. The selected configuration may therefore generate a net force acting on the plasma cell 200. Referring specifically to FIG. 11, the first wall 210*a* and the second wall 210*b* may be electrically insulated and grounded while the third wall 210*c* and the fourth wall 210*d* may each have an applied voltage that enables a net force to act on the plasma cell 200.

In some configurations, the third wall 210*c* has an applied voltage V that is equal to the potential of the plasma 10. By having an applied voltage V that is equal to the potential of the plasma 10, the sheath 10*b* that conforms to the third wall 210*c* behaves more akin to a plasma bulk region in that the constant voltage potential results in no electric field being present (i.e., the electric field is zero). This means that if the opposite facing wall, the fourth wall 210*d*, has an electric field from a voltage potential gradient, there will be a pressure on the fourth wall 210*d* that is not counterbalanced by the third wall 210*c*. In other words, the ion acceleration in the sheath 10*b* at the fourth wall 210*d* will cause a net force to be applied in that direction for the plasma cell 200. In FIG. 11, a voltage V is applied to the fourth wall 210*d* that is less than the potential of the plasma 10 causing a potential gradient and electric field to exist in the sheath 10*b* that accelerates ions towards the fourth wall 210*d*.

With a configuration like the plasma cell 200 of FIG. 11, a voltage can be selectively applied to, in turn, selectively apply a net force on the plasma cell 200. In other words, by controlling the electric fields of the sheath with particular voltages or no voltage, the net force of the plasma cell 200 can be turned off or on much like a switch. When a net force exists, the net force can function as a form of thrust that would push or propel the plasma cell 200 in a direction opposite the net force according to Newton's third law of action and reaction.

For a single plasma cell 200, the net force that can be generated by a configuration like FIG. 11 may appear to be nearly negligible. For example, an electrically-driven plasma (i.e., a plasma that has been generated via an electric field—an electrically generated plasma) can have an ion density of $n_i=10^{18}\ m^{-3}$, an electron temperature of at least $kT_e=1.6\cdot10^{-19}$ J (1 eV), and a sheath voltage $V_s=1.6\cdot10^{-18}$ J (10V). These values for an electrically-driven plasma according to equation (1) would result in a pressure or net force $$\frac{F}{A} = \sim 2Pa(N\cdot m^{-2}).$$

This would appear negligible since atmospheric pressure (1 atm) is equal to about 10 Pa. By this example, the plasma cell 200 produces a pressure in the range of 2 Newton per square meter. This means that to realize a force at least equivalent to atmospheric pressure would demand about tens of thousands of plasma cells 200.

Fortunately, the plasma cell like that of FIG. 11 is capable of having a unit cell length of about ten micrometers to about one hundred micrometers (~10-100 um). With this size, it is feasible that a plurality of plasma cells 200 may be stacked in an array to achieve a net force for the array that is non-negligible. For example, an array of plasma cells includes tens of thousands up to a hundred thousand plasma cells ($10^4$-$10^5$). Using the prior example estimations for an electrically-driven plasma, with each plasma cell 200 yielding 2 N per square meter, the array may generate upwards of 200,000 N of force (e.g., between 2 N×($10^4$-$10^5$)).

Traditionally, electrically-driven plasmas demand a surface area and an energizing cost that would likely be cost prohibitive in the formation of a plasma cell array. For instance, the plasma cell 200 would not be able to achieve a unit cell length of about ten micrometers to about one hundred micrometers using an electrically-driven plasma. The plasma cell 200 can ionize the gas within its volume using charged particle ionization rather than needing to electrically ionize the gas. In other words, much like the plasma doping process of the substrate described with respect to FIG. 5, charged particles may be used to ionize the gas in the plasma cell 200 to avoid the need to electrically generate the plasma within the plasma cell 200. In other words, each plasma cell 200 (or an entire array of plasma cells 200) may be exposed to ionizing radiation (i.e., an ionizing radiation source) causing the gas within the plasma cell 200 to become ionized, resulting in the formation of the plasma within the plasma cell 200. Once the gas is ionized, the proper voltages may be applied to the walls 210 of the plasma cell 200 to selectively exert the net force on the cell 200 or a summation of net forces for an array of cells 200.

Figure 12:
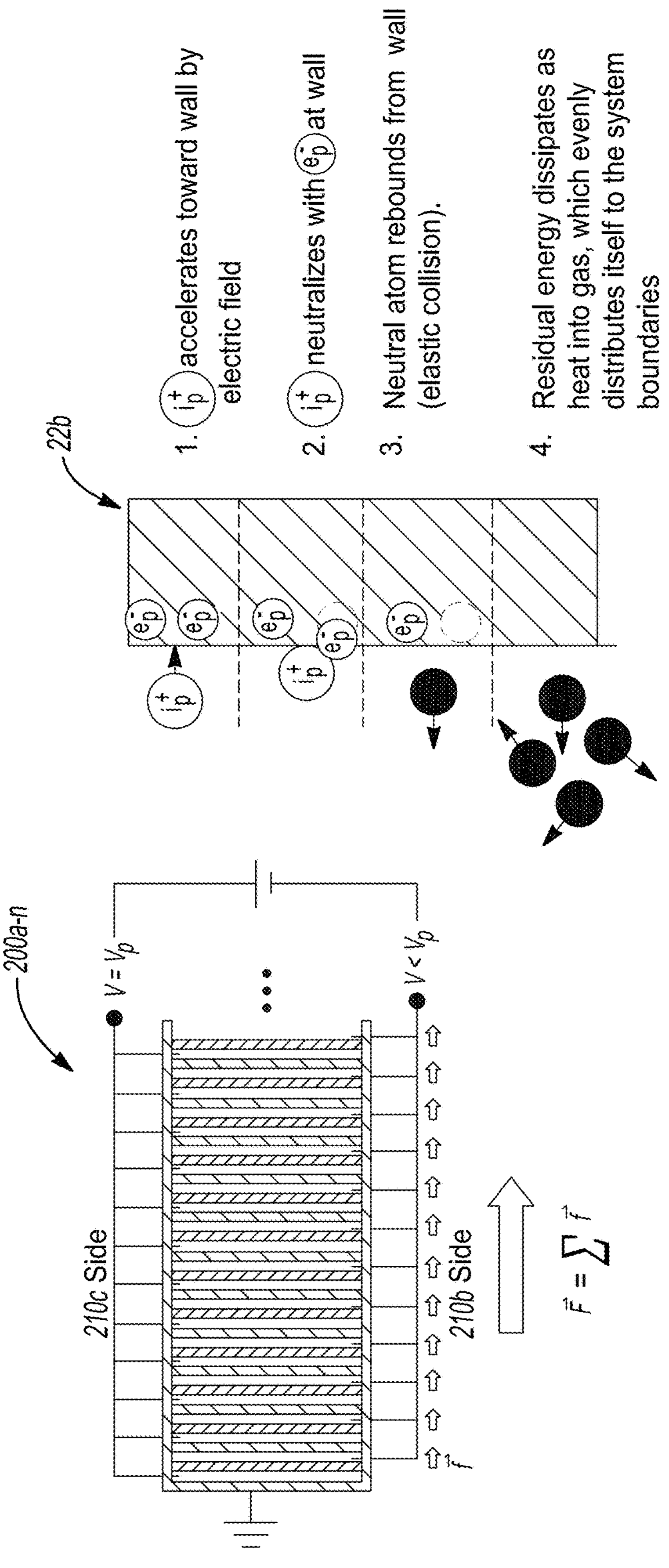
FIG. 12 is a schematic view of an example plasma cell array formed from a plasma cell according to the principles of the present disclosure.

FIG. 12 is an example of an array of plasma cells 200*a-n*. In this example, the plasma cells 200*a-n* are arranged in a stack configuration. Here, the stack configuration is such that all of the third walls 210*c* of the individual plasma cells 200 may be stacked on the same side of the array while all of the fourth walls 210*d* may be stacked on an opposite side of the array. For example, FIG. 12 collinearly aligns all of the third walls 210*c* and/or all of the fourth walls 210*d* of the plasma cells 200 within the array. In some configurations, the plasma cells 200 of the array are arranged in a manner such that a first terminal may be configured to receive an applied voltage (e.g., a voltage equal to the plasma potential or less than the plasma potential) and to supply that applied voltage in parallel to a particular wall of each plasma cell 200. In these configurations, it may be spatially advantageous to arrange all of the third walls 210*c* on a same side of the array to enable the first terminal to supply the applied voltage in parallel to each third wall 210*c*. Similarly, the plasma cells 200 of the array may also have a second terminal that receives an applied voltage and supplies that applied voltage in parallel to each fourth wall 210*d* of the plasma cell 200. With this two terminal configuration, the array can essentially have one voltage bus that applies the plasma potential to each plasma cell 200 and another voltage bus that applies a voltage less than the plasma potential to each plasma cell 200.

The following Clauses provide an exemplary configuration for in implant and related methods, as described above.

Clause 1: A method of depositing a material on a substrate having a first outer surface, a second outer surface opposite the first outer surface, and a thickness extending between the first outer surface and the second outer surface, wherein the substrate includes a charge-neutral ion deposition state within a volume of the thickness, the method comprising: doping the substrate with plasma to generate a charged ion deposition state for the substrate, the charged ion deposition state having a non-zero electric field within the volume of the thickness; and depositing ions on the substrate doped with plasma at one or more interstitial sites within the volume of the thickness.

Clause 2: The method of clause 1, wherein doping the substrate with plasma includes exposing the substrate to nuclear radiation.

Clause 3: The method of any of clauses 1 through 2, wherein: doping the substrate with plasma occurs using a particle-based ionizing mechanism; and depositing ions on the substrate doped with plasma occurs using an electrically generated plasma within a chemical vapor deposition chamber.

Clause 4: The method of any of clauses 1 through 3, wherein doping the substrate with plasma uses an ionizing mechanism initiated by a charged particle.

Clause 5: The method of clause 4, wherein the charged particle is an alpha particle.

Clause 6: The method of any of clauses 4 through 5, wherein the charged particle is a beta particle.

Clause 7: The method of any of clauses 1 through 6, wherein doping the substrate with plasma uses an ionizing mechanism initiated by a photon.

Clause 8: The method of clause 7, wherein the ionizing mechanism initiated by the photon occurs using gamma radiation.

Clause 9: The method of clause 1, wherein, in the charged ion deposition state, the substrate is in a state of radioactive decay.

Clause 10: The method of any of clauses 1 through 9, wherein: depositing ions on the substrate doped with plasma occurs within a plasma-enhanced chemical deposition reactor; and doping the substrate with plasma to generate a charged ion deposition state occurs external to the plasma-enhanced chemical deposition reactor.

Clause 11: The method of any of clauses 1 through 10, wherein depositing ions on the substrate doped with plasma includes: feeding a source gas into a chamber housing the substrate doped with plasma; and applying a voltage to a radio-frequency electrode for a predetermined period of time.

Clause 12: The method of clause 11, wherein the predetermined period of time corresponds to the deposition rate of ions at the one or more interstitial sites within the volume of the substrate.

Clause 13: The method of any of clauses 1 through 12, wherein the substrate includes a set of pores each defined by an opening greater than about ten microns.

Clause 14: A substrate comprising: a first outer surface; a second outer surface opposite the first outer surface; a region having a volume extending from the first outer surface to the second outer surface, wherein at least a portion of the volume defines a cavity of an interstitial site, the interstitial site defined by a wall having a surface, the surface including a plasma-formed deposition layer.

Clause 15: The substrate of clause 14, wherein the plasma-formed deposition layer is formed by a plasma disposed within the cavity, the plasma having an ionization state initiated by a charged particle.

Clause 16: The substrate of clause 15, wherein the charged particle is an alpha particle.

Clause 17: The substrate of any of clauses 15 through 16, wherein the charged particle is a beta particle.

Clause 18: The substrate of any of clauses 14 through 17, wherein the plasma-formed deposition layer is formed by a plasma disposed within the cavity, the plasma having an ionization state initiated by a photon.

Clause 19: The substrate of any of clauses 14 through 18, wherein the plasma-formed deposition layer is formed by a plasma disposed within the cavity, the plasma having an ionization state initiated by gamma radiation.

Clause 20: The substrate of any of clauses 14 through 19, wherein the cavity of the interstitial site is defined by an opening greater than about ten microns.

Clause 21: A system comprising: a chamber having a source gas input port and an exhaust gas outlet port; an electrode electrically coupled to a voltage source; and a plasma-doped substrate facing the electrode, wherein the plasma-doped substrate includes: a first outer surface; a second outer surface opposite the first outer surface; a region having a volume extending from the first outer surface to the second outer surface, wherein at least a portion of the volume defines a cavity of an interstitial site; and a plasma disposed within the cavity.

Clause 22: The system of clause 21, wherein a charged particle initiates an ionized state defining the plasma.

Clause 23: The system of clause 22, wherein the charged particle is an alpha particle.

Clause 24: The system of any of clauses 22 through 23, wherein the charged particle is a beta particle.

Clause 25: The system of any of clauses 22 through 24, wherein a photon initiates an ionized state defining the plasma.

Clause 26: The system of any of clauses 21 through 25, wherein gamma radiation initiated an ionized state defining the plasma.

Clause 27: The system of any of clauses 21 through 26, wherein the cavity of the interstitial site is defined by an opening greater than about ten microns.

Clause 28: A system comprising: a plurality of plasma cells, each plasma cell including: a plasma formed from a chemically non-reactive species of gas; a first wall; a second wall oppositely facing the first wall; a third wall extending between the first wall and the second wall, the third wall having a voltage equal to a potential of the plasma; and a fourth wall oppositely facing the third wall and extending between the first wall and the second wall, the fourth wall having a second voltage less than the potential of the plasma, wherein the first wall and the second wall form a first pair of opposite facing walls that are electrically insulated and grounded, wherein the plasma occupies a volume of the respective plasma cell between each of the first wall, the second wall, the third wall, and the fourth wall, and wherein the plurality of plasma cells are stacked in a configuration such that all third walls are on a same side of the stack facing all fourth walls on an opposite side of the stack.

Clause 29: The system of clause 28, wherein the configuration of all third walls on the same side facing all fourth walls collinearly aligns all third walls.

Clause 30: The system of any of clauses 28 through 29, wherein the configuration forms: a first terminal configured to maintain the first voltage in parallel to each third wall of the plurality of plasma cells; and a second terminal configured to receive the second voltage and supply the second voltage in parallel to each fourth wall of the plurality of plasma cells.

Clause 31: The system of any of clauses 28 through 30, wherein the plasma is formed from the chemically non-reactive species of gas by charged particle ionization.

Clause 32: The system of any of clauses 28 through 31, wherein at least one of the first voltage or the second voltage is selectively applied.

Clause 33: The system of any of clauses 28 through 32, wherein selectively applying the at least one of the first voltage or the second voltage selectively applies a net force on the system.

CONCLUSION

The foregoing description is merely illustrative in nature and is in no way intended to limit the disclosure, its application, or uses. The broad teachings of the disclosure can be implemented in a variety of forms. Therefore, while this disclosure includes particular examples, the true scope of the disclosure should not be so limited since other modifications will become apparent upon a study of the drawings, the specification, and the following claims. In the written description and claims, one or more steps within a method may be executed in a different order (or concurrently) without altering the principles of the present disclosure. Similarly, one or more instructions stored in a non-transitory computer-readable medium may be executed in a different order (or concurrently) without altering the principles of the present disclosure. Unless indicated otherwise, numbering or other labeling of instructions or method steps is done for convenient reference, not to indicate a fixed order.

Further, although each of the embodiments is described above as having certain features, any one or more of those features described with respect to any embodiment of the disclosure can be implemented in and/or combined with features of any of the other embodiments, even if that combination is not explicitly described. In other words, the described embodiments are not mutually exclusive, and permutations of one or more embodiments with one another remain within the scope of this disclosure.

Spatial and functional relationships between elements (for example, between modules, circuit elements, semiconductor layers, etc.) are described using various terms, including "connected," "engaged," "coupled," "adjacent," "next to," "on top of," "above," "below," and "disposed." Unless explicitly described as being "direct," when a relationship between first and second elements is described in the above disclosure, that relationship encompasses a direct relationship where no other intervening elements are present between the first and second elements as well as an indirect relationship where one or more intervening elements are present between the first and second elements.

The phrase "at least one of A, B, or C" should be construed to mean a logical (A OR B OR C), using a non-exclusive logical OR, and should not be construed to mean "at least one of A, at least one of B, and at least one of C." The term "set" does not necessarily exclude the empty set—in other words, in some circumstances a "set" may have zero elements. The term "non-empty set" may be used to indicate exclusion of the empty set—in other words, a non-empty set will always have one or more elements. The term "subset" does not necessarily require a proper subset. In other words, a "subset" of a first set may be coextensive with (equal to) the first set. Further, the term "subset" does not necessarily exclude the empty set in some circumstances a "subset" may have zero elements.

In the figures, the direction of an arrow, as indicated by the arrowhead, generally demonstrates the flow of information (such as data or instructions) that is of interest to the illustration. For example, when element A and element B exchange a variety of information but information transmitted from element A to element B is relevant to the illustration, the arrow may point from element A to element B. This unidirectional arrow does not imply that no other information is transmitted from element B to element A. Further, for information sent from element A to element B, element B may send requests for, or receipt acknowledgements of, the information to element A.

What is claimed is:

1. A method of depositing a material on a substrate having a first outer surface, a second outer surface opposite the first outer surface, and a thickness extending between the first outer surface and the second outer surface, wherein the substrate includes a charge-neutral ion deposition state within a volume of the thickness, the method comprising:

doping the substrate with plasma to generate a charged ion deposition state for the substrate, the charged ion deposition state having a non-zero electric field within the volume of the thickness; and depositing ions on the substrate doped with plasma at one or more interstitial sites within the volume of the thickness, wherein doping the substrate with plasma includes exposing the substrate to nuclear radiation.

2. The method of claim 1, wherein:

doping the substrate with plasma occurs using a particle-based ionizing mechanism; and depositing ions on the substrate doped with plasma occurs using an electrically generated plasma within a chemical vapor deposition chamber.

3. The method of claim 1, wherein doping the substrate with plasma uses an ionizing mechanism initiated by a charged particle.

4. The method of claim 1, wherein doping the substrate with plasma uses an ionizing mechanism initiated by a photon.

5. The method of claim 1, wherein, in the charged ion deposition state, the substrate is in a state of radioactive decay.

6. The method of claim 1, wherein:

depositing ions on the substrate doped with plasma occurs within a plasma-enhanced chemical deposition reactor; and doping the substrate with plasma to generate a charged ion deposition state occurs external to the plasma-enhanced chemical deposition reactor.

7. The method of claim 1, wherein depositing ions on the substrate doped with plasma includes:

feeding a source gas into a chamber housing the substrate doped with plasma; and applying a voltage to a radio-frequency electrode for a predetermined period of time.

8. The method of claim 1, wherein the substrate includes a set of pores each defined by an opening greater than about ten microns.

9. A substrate comprising:

a first outer surface;

a second outer surface opposite the first outer surface; and a region having a volume extending from the first outer surface to the second outer surface, wherein at least a portion of the volume defines a cavity of an interstitial site, the interstitial site defined by a wall having a surface, the surface including a plasma-formed deposition layer, wherein the plasma-formed deposition layer is formed by a plasma disposed within the cavity, the plasma having an ionization state initiated by gamma radiation.

10. The substrate of claim 9, wherein the plasma-formed deposition layer is formed by a plasma disposed within the cavity, the plasma having an ionization state initiated by a charged particle.

11. The substrate of claim 9, wherein the plasma-formed deposition layer is formed by a plasma disposed within the cavity, the plasma having an ionization state initiated by a photon.

12. The substrate of claim 9, wherein the cavity of the interstitial site is defined by an opening greater than about ten microns.

13. A system comprising:

a chamber having a source gas input port and an exhaust gas outlet port;

an electrode electrically coupled to a voltage source; and a plasma-doped substrate facing the electrode, wherein the plasma-doped substrate includes:

a first outer surface;

a second outer surface opposite the first outer surface;

a region having a volume extending from the first outer surface to the second outer surface, wherein at least a portion of the volume defines a cavity of an interstitial site; and a plasma disposed within the cavity, wherein gamma radiation initiates an ionized state defining the plasma.

14. The system of claim 13, wherein a charged particle initiates an ionized state defining the plasma.

15. The system of claim 13, wherein a photon initiates an ionized state defining the plasma.

16. The system of claim 13, wherein the cavity of the interstitial site is defined by an opening greater than about ten microns.

17. A method of depositing a material on a substrate having a first outer surface, a second outer surface opposite the first outer surface, and a thickness extending between the first outer surface and the second outer surface, wherein the substrate includes a charge-neutral ion deposition state within a volume of the thickness, the method comprising:

doping the substrate with plasma to generate a charged ion deposition state for the substrate, the charged ion deposition state having a non-zero electric field within the volume of the thickness; and depositing ions on the substrate doped with plasma at one or more interstitial sites within the volume of the thickness, wherein, in the charged ion deposition state, the substrate is in a state of radioactive decay.

18. A method of depositing a material on a substrate having a first outer surface, a second outer surface opposite the first outer surface, and a thickness extending between the first outer surface and the second outer surface, wherein the substrate includes a charge-neutral ion deposition state within a volume of the thickness, the method comprising:

doping the substrate with plasma to generate a charged ion deposition state for the substrate, the charged ion deposition state having a non-zero electric field within the volume of the thickness; and depositing ions on the substrate doped with plasma at one or more interstitial sites within the volume of the thickness, wherein:

depositing ions on the substrate doped with plasma occurs within a plasma-enhanced chemical deposition reactor; and doping the substrate with plasma to generate a charged ion deposition state occurs external to the plasma-enhanced chemical deposition reactor.

* * * * *